US010890609B2

(12) United States Patent
Schultheis et al.

(10) Patent No.: US 10,890,609 B2
(45) Date of Patent: Jan. 12, 2021

(54) SIGNAL SOURCE, TEST SYSTEM AND METHOD FOR TESTING A DEVICE UNDER TEST

(71) Applicant: Rohde & Schwarz GmbH & Co. KG, Munich (DE)

(72) Inventors: Jan-Patrick Schultheis, Kirchheim (DE); Werner Held, Poecking (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 89 days.

(21) Appl. No.: 16/160,792

(22) Filed: Oct. 15, 2018

(65) Prior Publication Data
US 2020/0116771 A1 Apr. 16, 2020

(51) Int. Cl.
G01R 27/28 (2006.01)
H03K 21/02 (2006.01)

(52) U.S. Cl.
CPC ............ G01R 27/28 (2013.01); H03K 21/02 (2013.01)

(58) Field of Classification Search
CPC .................................. G01R 27/28; H03K 21/02
USPC ............................................. 324/650
See application file for complete search history.

(56) References Cited

U.S. PATENT DOCUMENTS

| 5,642,039 A * | 6/1997 | Bradley | G01R 23/163 324/646 |
|---|---|---|---|
| 6,163,223 A | 12/2000 | Kapetanic et al. | |
| 6,396,355 B1 * | 5/2002 | Rezin | H03L 7/189 327/156 |
| 6,421,624 B1 * | 7/2002 | Nakayama | G01R 35/005 702/117 |
| 7,518,353 B2 | 4/2009 | Tanbakuchi et al. | |
| 2010/0141305 A1 * | 6/2010 | Ortler | G01R 27/28 327/117 |
| 2013/0188795 A1 * | 7/2013 | Quan | G01R 31/2825 381/58 |
| 2013/0278304 A1 * | 10/2013 | Goldblatt | H03B 19/00 327/117 |
| 2014/0111184 A1 * | 4/2014 | Dalebroux | G01R 13/0236 324/76.39 |
| 2015/0077136 A1 * | 3/2015 | Li | G01R 27/28 324/617 |
| 2016/0072507 A1 * | 3/2016 | Jia | H03K 21/02 327/118 |

(Continued)

Primary Examiner — Christopher P McAndrew
(74) Attorney, Agent, or Firm — Christensen O'Connor; Johnson Kindness PLLC

(57) ABSTRACT

A signal source is described. The signal source comprises a signal generator, a first frequency divider and a second frequency divider. The first and the second frequency divider are each connected to the signal generator. The signal generator is configured to generate a source signal having a source frequency and to selectively forward the source signal to at least one of the first frequency divider and the second frequency divider. The first frequency divider is established as an integer frequency divider and is configured to generate a first output signal from the source signal. The second frequency divider is different from the first frequency divider and is configured to generate a second output signal from the source signal, wherein a phase noise of the second output signal is considerably lower than a phase noise of the first output signal. Moreover, a test system and a method for testing a device under test are described.

19 Claims, 2 Drawing Sheets

(56) References Cited

U.S. PATENT DOCUMENTS

| | | | |
|---|---|---|---|
| 2016/0099708 A1* | 4/2016 | Taskin | H03K 21/10 |
| | | | 331/57 |
| 2017/0012584 A1* | 1/2017 | Lee | H03B 27/00 |
| 2017/0016953 A1* | 1/2017 | Beer | G01R 27/28 |
| 2017/0045603 A1* | 2/2017 | Krauska | G01R 35/005 |
| 2017/0047892 A1* | 2/2017 | Taskin | H03K 21/10 |
| 2018/0278247 A1* | 9/2018 | Shirao | H03K 17/22 |
| 2018/0358954 A1* | 12/2018 | Kim | H03K 5/06 |

* cited by examiner

SIGNAL SOURCE, TEST SYSTEM AND METHOD FOR TESTING A DEVICE UNDER TEST

FIELD OF THE DISCLOSURE

Embodiments of the present disclosure relate generally to a signal source as well as to a test system and a method for testing a device under test.

BACKGROUND

Some measurement instruments employ a signal source in order to apply an output signal having a predefined frequency to a device under test. In many applications, it is desirable to have a signal source that is configured to generate the output signal with a variable frequency.

However, signal sources with variable frequency usually suffer from a high phase noise in the output signal and/or the phase of the output signal is not known and cannot be determined, which deteriorates the quality of measurement results.

Accordingly, there is a need for a signal source as well as for a test system and a method for testing a device under test that resolve these issues.

SUMMARY

Embodiments of the present disclosure provide a signal source. The signal source comprises a signal generator, a first frequency divider and a second frequency divider. The first and the second frequency divider are each connected to the signal generator. The signal generator is configured to generate a source signal having a source frequency and to selectively forward the source signal to at least one of the first frequency divider and the second frequency divider. The first frequency divider is established as an integer frequency divider and is configured to generate a first output signal from the source signal. The second frequency divider is different from the first frequency divider and is configured to generate a second output signal from the source signal, wherein a phase noise of the second output signal is considerably lower than a phase noise of the first output signal.

Therein, the term "considerably lower" is to be understood to mean that the phase noise of the second output signal is less than 75% of the phase noise of the first output signal in some embodiments, is less than 50% in other embodiments, and is less than 25% in some other embodiments. In some other embodiments, "considerably lower" is to be understood to mean that the phase noise of the second output signal is between 25% less and 75% less of the phase noise of the first output signal. Therein, a time average of the phase noise and/or a root mean square of the phase noise may be considered.

Moreover, the term "signal" is to be understood to mean an electrical signal.

As the first frequency divider is established as an integer frequency divider, the phase of the first output signal is known or can be easily determined. However, the phase noise of the first output signal may be rather high.

However, the second output signal having a considerably lower phase noise than the first output signal may have an unknown phase.

Thus, the signal source according to the disclosure is configured to generate two different output signals, wherein the first output signal has a known phase, and wherein the second output signal has a low phase noise, namely a lower one than the one of the first output signal. As will be explained in more detail below, during measurement these advantageous properties of the two output signals can be combined in order to substantially enhance measurement results.

The signal source may be established as a signal source for a measurement instrument. In some embodiments, the signal source may be established separately from the measurement instrument or may be part of the measurement instrument.

In some embodiments, the signal source may be established by hardware components.

According to one aspect of the disclosure, the second frequency divider is established as a fractional frequency divider. Fractional frequency dividers inherently exhibit a rather low phase noise of the output signal and are thus particularly suitable for the signal source according to the disclosure. However, the phase is unknown since the fractional frequency divider has a random offset with regard to phase. This random offset cannot be determined by solely taking measurements of the fractional frequency divider into account.

In an embodiment of the disclosure, the signal generator is configured to generate the source signal with the source frequency lying within a predetermined frequency spectrum. In other words, the signal generator is configured to vary the frequency of the source signal. The frequency spectrum may be discrete or essentially continuous and/or may comprise several essentially continuous frequency bands. Thus, the signal source is able to supply output signals with different frequencies.

According to another embodiment of the disclosure, the signal generator is configured to generate and forward a first source signal with a first source frequency to the first frequency divider and to generate and forward a second source signal with a second source frequency to the second frequency divider, wherein the frequencies of the first output signal and the second output signal are equal. Put another way, the source frequencies forwarded to the first frequency divider and to the second frequency divider are chosen such that the frequencies of the first output signal and of the second output signal are equal. As will be explained in more detail below, this embodiment of the signal source is particularly useful if two measurements of the device under test are to be compared to each other, wherein the device under test is supplied with both output signals consecutively.

Embodiments of the present disclosure also provide a test system for testing a device under test. The test system comprises a signal source and a measurement instrument. The signal source comprises a signal generator, a first frequency divider and a second frequency divider. The first and the second frequency divider are each connected to the signal generator. The signal generator is configured to generate a source signal having a source frequency and to selectively forward the source signal to at least one of the first frequency divider and the second frequency divider. The first frequency divider is established as an integer frequency divider and is configured to generate a first output signal from the source signal. The second frequency divider is different from the first frequency divider and is configured to generate a second output signal from the source signal, wherein a phase noise of the second output signal is considerably lower than a phase noise of the first output signal. The signal source is configured to consecutively forward the first output signal and the second output signal to the device under test. The measurement instrument is configured to consecutively analyze a response of the device under test to the first output signal and a response of the device under test to the second output signal.

However, the second output signal having a considerably lower phase noise than the first output signal may have an unknown phase. Thus, the signal source is configured to generate two different output signals, wherein the first output signal has a known phase but relatively high phase noise, and wherein the second output signal has a low phase noise, namely a lower one than the one of the first output signal, but unknown phase.

By repeating the same measurement with the two output signals of the signal source, the advantageous properties of the two output signals (known phase and low phase noise, respectively) can be combined in order to enhance the measurement result.

In other words, the second output signal may be corrected with regard to the random phase offset (unknown phase) by using the first output signal having a known phase. Accordingly, only the smaller phase noise of the second output signal remains.

The signal source may be part of the measurement instrument or may be established separately.

According to one aspect of the disclosure, the measurement instrument is established as a vector network analyzer. Thus, the measurement instrument is configured to measure so-called S-parameters, which correspond to transmission between several ports of the device under test and/or to reflection at a certain port of the device in the test.

The signal generator may be configured to generate the source signal with the source frequency lying within a predetermined frequency spectrum. In other words, the signal generator is configured to vary the frequency of the source signal. The frequency spectrum may be discrete or essentially continuous and/or may comprise several essentially continuous frequency bands. Thus, the signal source is able to supply output signals with different frequencies. Accordingly, a response spectrum of the device under test may be measured by the measurement instrument.

In an embodiment of the disclosure, the signal generator is configured to generate and forward a first source signal with a first source frequency to the first frequency divider and to generate and forward a second source signal with a second source frequency to the second frequency divider, wherein the frequencies of the first output signal and the second output signal are equal. Put another way, the source frequencies forwarded to the first frequency divider and to the second frequency divider are chosen such that the frequencies of the first output signal and of the second output signal are equal. Thus, the response of the device under test to the output signals can be analyzed by the measurement instrument for equal output signal frequencies.

In another embodiment of the disclosure, the measurement instrument is configured to compare the response of the device under test to the first output signal of the signal source with the response of the device under test to the second output signal of the signal source. By comparing the responses of the device under test to two output signals, the advantageous properties of the two output signals (known phase and low phase noise, respectively) can be used in order to enhance the measurement results.

In some embodiments, the measurement instrument is configured to determine a random phase offset of the second output signal based on the comparison of the two responses. The random phase offset is an intrinsic property of the second frequency divider having a low phase noise. In other words, the advantageous property of the first output signal, namely the known phase, is used to determine the phase offset of the second output signal. The phase offset of the second output signal can then be used to determine the absolute phase of the second output signal, which in turn can be used for further analysis of the response of the device under test, in some embodiments for the analysis of the response to the second output signal, which already has a rather low phase noise.

The measurement instrument may be configured to determine the random phase offset by solving a coupled system of equations. In some embodiments, the coupled system of equations may be a coupled system of linear equations. The coupled system of equations may be predetermined or maybe derived based on the two responses of the device under test to the first and the second output signal.

According to another embodiment of the disclosure, the measurement instrument is configured to correct the analysis of the response of the device under test to the second output signal based on the determined phase offset. In some embodiments, the determined phase offset is used to determine the absolute phase of the second output signal, and the measurement data corresponding to the response of the device under test to the second output signal is corrected based on the phase of the second output signal. In other words, measurement data about the device under test with known phase and low phase noise is obtained.

The second frequency divider may be established as a fractional frequency divider. Fractional frequency dividers inherently exhibit a rather low phase noise of the output signal and are thus particularly suitable for the test system according to the disclosure. However, the phase is unknown since a random offset with regard to phase is provided.

According to a further aspect of the disclosure, a device under test is provided, the device under test being connected to the signal source and being connected to the measurement instrument.

Embodiments of the disclosure also provide a method for testing a device under test. The method comprises the following steps: providing a signal source comprising a signal generator, a first frequency divider and a second frequency divider; providing a measurement instrument and the device under test; generating a source signal via the signal generator and consecutively forwarding the source signal to the first frequency divider and the second frequency divider; generating a first output signal and a second output signal from the source signal via the first frequency divider and the second frequency divider, respectively, wherein a phase noise of the second output signal is considerably lower than a phase noise of the first output signal; consecutively forwarding the first output signal and the second output signal to the device under test; and analyzing a response of the device under test to the output signals of the signal source via the measurement instrument.

Regarding the advantages of the different embodiments of the method for testing a device under test, reference is made to the explanations given above concerning the various embodiments of the test system according to the disclosure and/or the signal source mentioned above.

In some embodiments, a frequency of the first output signal and a frequency of the second output signal are equal. Put another way, the source frequencies forwarded to the first frequency divider and to the second frequency divider are chosen such that the frequencies of the first output signal and of the second output signal are equal. Thus, the response of the device under test to the output signals can be analyzed by the measurement instrument for equal output signal frequencies.

In another embodiment of the disclosure, the response of the device under test to the first output signal is compared to the response of the device under test to the second output signal. By comparing the responses of the device under test to two output signals, the advantageous properties of the two output signals (known phase and low phase noise, respectively) can be used in order to enhance the measurement results.

A random phase offset of the second output signal may be determined based on the comparison of the two responses. Thus, a combination of the advantageous effects or rather characteristics of the output signals may be combined aby comparing the respective responses. In other words, the advantageous property of the first output signal, namely the known phase, is used to determine the phase offset of the second output signal. The phase offset of the second output signal can then be used to determine the absolute phase of the second output signal, which in turn can be used for further analysis of the response of the device under test, in some embodiments for the analysis of the response to the second output signal, which already has a rather low phase noise.

According to a further aspect of the disclosure, the random phase offset is determined by solving a coupled system of equations. In some embodiments, the coupled system of equations may be a coupled system of linear equations. The coupled system of equations may be predetermined or maybe derived based on the two responses of the device under test to the first and the second output signal.

In some embodiments, the analysis of the response of the device under test to the second output signal is corrected based on the determined phase offset. In some embodiments, the determined phase offset is used to determine the absolute phase of the second output signal, and the measurement data corresponding to the response of the device under test to the second output signal is corrected based on the phase of the second output signal. In other words, measurement data about the device under test with known phase and low phase noise is obtained.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
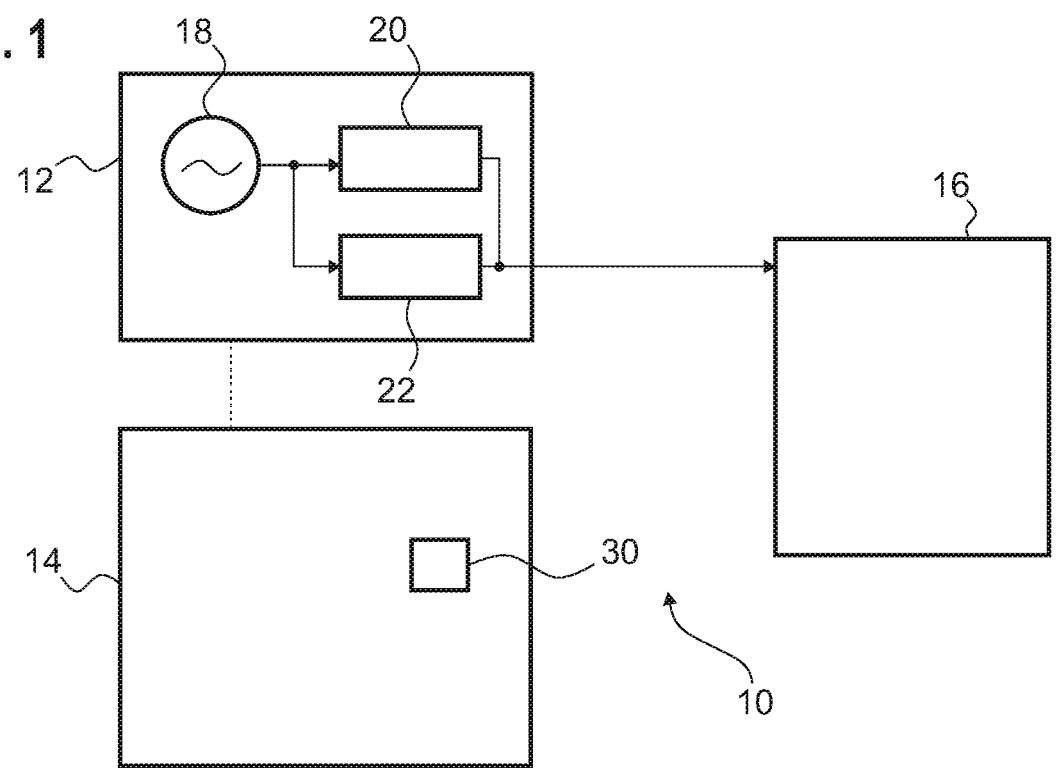
FIG. 1 schematically shows a first embodiment of a test system according to the disclosure.

FIG. 1 schematically shows a representative embodiment of a test system 10 comprising a signal source 12, a measurement instrument 14 and a device under test 16 being connected to both the signal source 12 and the measurement instrument 14. In the embodiment shown, the signal source 12 comprises a signal generator 18, a first frequency divider 20 and a second frequency divider 22, wherein the signal generator 18 is connected to the first frequency divider 20 and to the second frequency divider 22 in a signal transmitting manner. The first frequency divider 20 and the second frequency divider 22 are both connected to the device under test 16 in a signal transmitting manner.

The signal generator 18 is configured to generate a source signal that has a certain source frequency and to selectively forward the source signal to one of the frequency dividers 20, 22 at a time. The signal generator 18 may be configured to generate source signals with different source frequencies, wherein the source frequencies lie within a predetermined frequency spectrum that may be discrete or essentially continuous, or that may lie within one of several essentially continuous frequency bands.

In some embodiments, the first frequency divider 20 is established as an integer frequency divider and is configured to generate a first output signal from the source signal. In these or other embodiments, the second frequency divider 22 is established as a fractional frequency divider and is configured to generate a second output signal from the source signal.

The measurement instrument 14 may be any kind of measurement device suitable for performing a test procedure on the device under test 16. In some embodiments, the measurement instrument 14 is established as a vector network analyzer.

Figure 2:
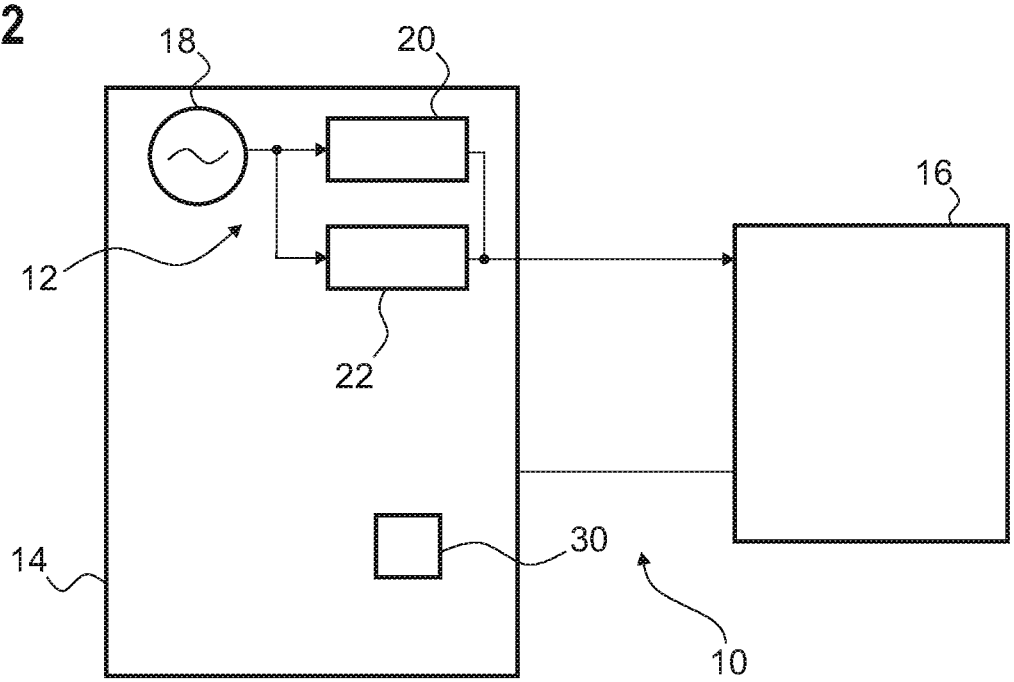
FIG. 2 schematically shows a second embodiment of a test system according to the disclosure.

In the embodiment shown in FIG. 1, the measurement instrument 14 and the signal source 12 are established separately from each other. In this case, the measurement instrument 14 may be connected to the signal source 12 (as indicated by the dashed lines in FIG. 1) and may be configured to control the signal source 12 to generate an output signal with desired properties. However, as shown in FIG. 2, the signal source 12 may also be part of the measurement instrument 14.

In some embodiments, the components mentioned above may be established by hardware components. In other embodiments, the components mentioned above may be established by a combination of hardware and software components Turning now to FIG. 3, there is shown another representative embodiment of a test system 10, wherein the measurement instrument 14 is established as a vector network analyzer. In this embodiment, the device under test 16 has a first port 24 and a second port 26, wherein the measurement instrument 14 is connected to both ports 24, 26. Like above, the measurement instrument 14 may be established separately from the signal source 12 and may be connected to the signal source 12 in a signal transmitting manner. Alternatively, the signal source 12 may be part of the measurement instrument 14.

The test system 10 also comprises a switch 28, via which the first frequency divider 20 and the second frequency divider 22 may be selectively connected with the first port 24 or the second port 26 of the device under test 16. The switch 28 may be established separately from the signal source 12 or may be part of the signal source 12.

Figure 4:
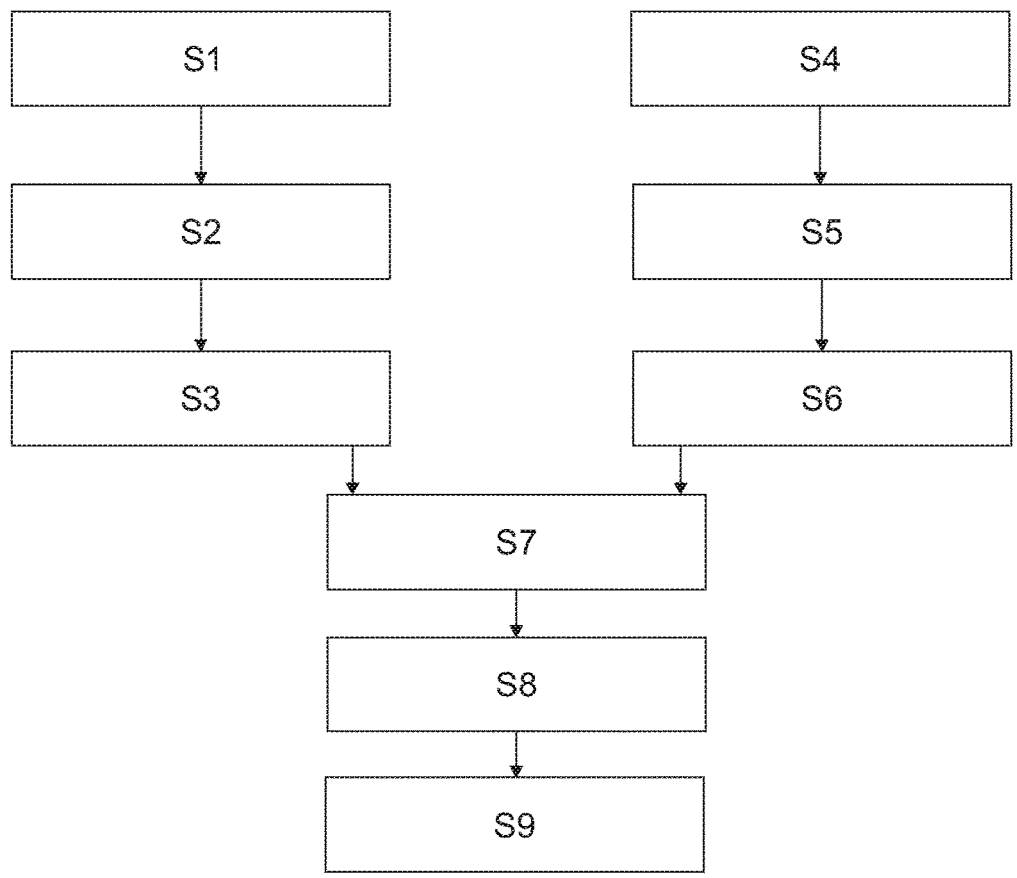
FIG. 4 schematically shows a block diagram of a representative method according to the disclosure.

The test system 10 is configured to perform a method for testing the device under test 16, which method will be explained in more detail in the following with reference to FIG. 4. A first source signal having a first source frequency $f_{s1}$ is generated by the signal generator 18 and forwarded to the first frequency divider 20 (step S1).

The source signal is converted into a first output signal by the first frequency divider 20 and forwarded to the device under test 16 (step S2), wherein the frequency $f_{o1}$ of the first output signal is equal to the first source frequency $f_{s1}$ divided by an integer number N, i.e. it holds $f_{o1}=f_{s1}/N$.

As the first frequency divider 20 is established as an integer frequency divider, the phase of the first output signal is known or can be easily determined. However, phase noise of the first output signal is rather high due to the necessarily high first source frequency $f_{s1}$.

Now, a response of the device under test 16 to the first output signal is measured and analyzed by the measurement instrument 14 (step S3). In step S3, measurement data corresponding to the response of the device under test 16 to the first output signal may be generated and stored on a storage medium 30 of the measurement instrument 14.

The measurement described above may be repeated for several different first output frequencies, such that the response spectrum of the device under test 16 is obtained.

Figure 3:
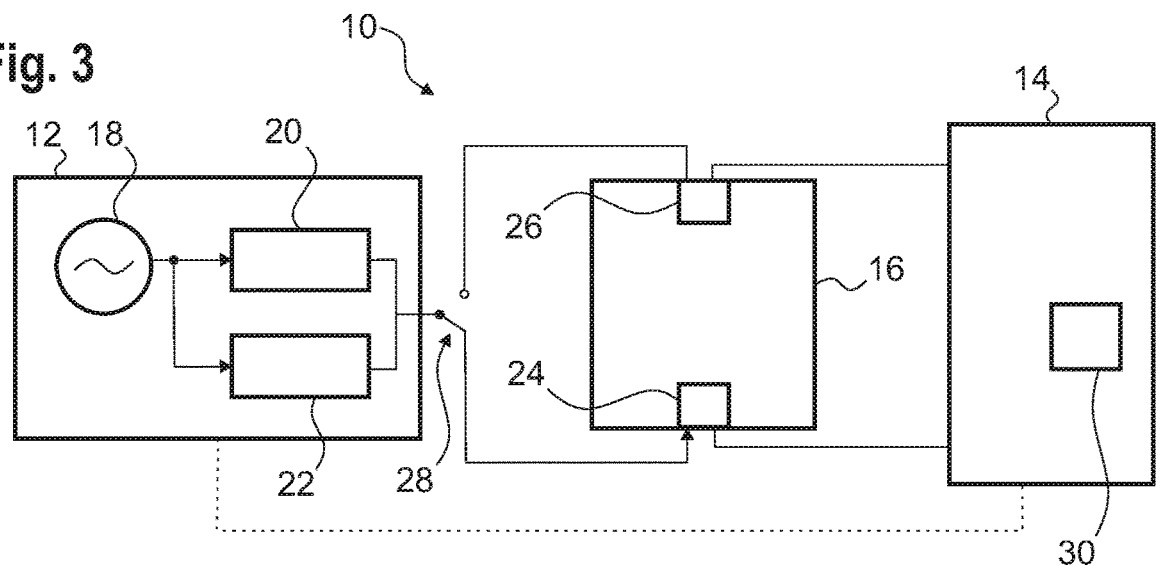
FIG. 3 schematically shows a third embodiment of a test system according to the disclosure.

If the test system 10 is established as shown in FIG. 3, steps S1 to S3 may be performed for each of the two ports 24, 26 of the device under test 16. In other words, first the steps S1 to S3 are performed while the signal source 12 is connected to the first port 24, wherein the switch 28 is in the position that is shown in FIG. 3. Then, the position of the switch 28 is changed such that the signal source is connected to the second port 26, and the steps S1 to S3 are repeated.

In each of the two iterations of steps S1 to S3, a transmission between the two ports 24, 26 and/or a reflection at the respective port 24, 26 may be measured by the measurement instrument 14, which corresponds to a measurement of the so-called S-parameters.

Before step S1 is started or after step S3 is done, a second source signal having a second source frequency $f_{s2}$ is generated by the signal generator 18 and forwarded to the second frequency divider 22 (step S4). The second source signal is converted into a second output signal by the second frequency divider 22 and forwarded to the device under test 16 (step S5), wherein the frequency $f_{o2}$ of the second output signal is equal to the second source frequency $f_{s2}$ times a fraction of two integer numbers M and L, i.e. it holds $f_{o2}=M/L*f_{s2}$.

Moreover, the frequencies $f_{o1}$ and $f_{o2}$ of the two output signals are equal. As the second frequency divider 22 is established as an fractional frequency divider, the second source frequency $f_{s2}$ can be much lower than the first source frequency $f_{s1}$, and the phase noise of the second output signal is considerably lower than the phase noise of the first output signal. The phase noise of the second output signal may be less than 75% of the phase noise of the first output signal, in some embodiments less than 50%, for example less than 25%. In some embodiments, the phase noise of the second output signal is between 25% and 75% of the phase noise of the first output signal. Therein, a time average of the phase noise and or a root mean square of the phase noise may be considered.

However, the phase of the second output signal cannot be easily determined, as it contains a random phase offset. More precisely, if the phase of the first output signal equals $p_N$, the phase of the second output signal equals $$p_{M/L}=p_0+n*360°/L+p_N,$$

wherein n is an integer random number for a poly phase system that comprises the first and the second output signal, wherein n cannot easily be determined. $p_0$ corresponds to a phase difference due to different signal paths of the first and second output signal, wherein $p_0$ may remain unknown or may be determined.

Now, a response of the device under test 16 to the second output signal is measured and analyzed by the measurement instrument 14 (step S6). In step S6, measurement data corresponding to the response of the device under test 16 to the second output signal may be generated and stored on the storage medium 30 of the measurement instrument 14.

The measurements described above may be repeated for several different second output frequencies, such that a further response spectrum of the device under test 16 is obtained.

If the test system 10 is established as shown in FIG. 3, the steps S1 to S3 may be performed for each of the two ports 24, 26 of the device under test 16 in order to obtain the S-parameters as explained above.

Next, the measurement data corresponding to the response of the device under test 16 to the first output signal and to the second output signal is compared in order to determine the random phase offset of the second output signal (step S7).

In other words, the responses of the device under test 16 to the first output signal and to the second output signal are compared in order to determine the random integer number n mentioned above.

From the measurement data, a coupled system of equations can be derived, which coupled system of equations is then solved in order to determine the random phase offset of the second output signal (step S8).

In some embodiments, the coupled system of equations is a coupled system of linear equations. More precisely, the couples system of equations may have the following form:

$$p_{L0}-p_{T0}=D=p_0+n_0(\Phi)$$

$$p_L-p_T-D=p_0+n(\Phi)-D=(n-n_0)(\Phi)=dn(\Phi)$$

$$p'_L=p_L-D-dn(\Phi)$$

$$p'_L=p_L-p_0-n_0(\Phi)-(n-n_0)(\Phi)$$

$$p'_L=p_L-p_0-n(\Phi)$$

Therein, $p_T$ is the phase of a signal from the first frequency divider 20, i.e. the phase of the first output signal, and $p_L$, is the phase of a signal from the second frequency divider 22, i.e. the phase of the second output signal. $p_{T0}$ and $p_{L0}$ are previously recorded reference quantities for the phase of the first output signal and the phase of the second output signal, respectively, and their difference defines the parameter D as stated in the first line of the equations given above. The parameter D thus may be determined during calibration of the test system 10.

$p_0$ represents the difference in phase between $p_L$, and $p_T$ due to length differences of the respective signal paths, as explained above.

Moreover, n is the random integer determining the random phase offset of the second output signal and $n_0$ is the corresponding reference value, wherein ($\Phi$) is the size of the poly phase. dn is an integer and is defined by the second line of the equations given above, i.e. the definition of dn is given by $dn(\Phi)=(n-n_0)(\Phi)$. The parameter dn may be determined from the measurement data corresponding to the response of the device under test 16 to the first output signal and to the second output signal.

Knowing D from the reference measurement (e.g. the calibration of the test system 10) and dn from the comparison of the two responses of the device under test 16 to the first and to the second output signal, the unknown phase can be removed from the second output signal, as is shown in the last three lines of the equations given above. Accordingly, $p'_L$, corresponds to $p_L$, but with the unknown phase $p_0+n(\Phi)$ removed. In other words, the phase of $p'_L$ is known.

After the random phase offset is determined, it can be used to correct the measurement data corresponding to the response of the device under test 16 to the second output signal (step S9).

As the phase noise of the second output signal inherently is very low, a precise result for the response of the device in the test 16 to the second output signal is obtained.

Put another way, the test system 10 employs two different output signals, one with known phase but high phase noise and one with unknown phase but low phase noise in order to combine the advantageous properties of the two output signals (known phase and low phase noise, respectively) in order to obtain a measurement result for the response of the device under test 16 having a high accuracy.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A signal source, comprising:
    a signal generator, a first frequency divider and a second frequency divider, the first second frequency divider and the second frequency divider each being connected to the signal generator,
    the signal generator being configured to generate a source signal having a source frequency and to selectively forward the source signal to at least one of the first frequency divider or the second frequency divider;
    the first frequency divider being established as an integer frequency divider and being configured to generate a first output signal from the source signal; and
    the second frequency divider being different from the first frequency divider and being configured to generate a second output signal from the source signal,
    wherein a phase noise of the second output signal is considerably lower than a phase noise of the first output signal,
    wherein the signal generator is configured to generate and forward a first source signal with a first source frequency to the first frequency divider and to generate and forward a second source signal with a second source frequency to the second frequency divider, wherein the frequencies of the first output signal and the second output signal are equal.

2. The signal source of claim 1, wherein the second frequency divider is established as a fractional frequency divider.

3. The signal source of claim 1, wherein the signal generator is configured to generate the source signal with the source frequency lying within a predetermined frequency spectrum.

4. A test system for testing a device under test, comprising:
    a signal source comprising
        a signal generator;
        a first frequency divider; and
        a second frequency divider,
        the first and the second frequency divider each being connected to the signal generator, the signal generator being configured to generate a source signal having a source frequency and to selectively forward the source signal to at least one of the first frequency divider and the second frequency divider, the first frequency divider being established as an integer frequency divider and being configured to generate a first output signal from the source signal, and the second frequency divider being different from the first frequency divider and being configured to generate a second output signal from the source signal, wherein a phase noise of the second output signal is considerably lower than a phase noise of the first output signal, wherein the signal source is configured to consecutively forward the first output signal and the second output signal to the device under test, and
    a measurement instrument configured to consecutively analyze a response of the device under test to the first output signal and a response of the device under test to the second output signal.

5. The test system of claim 4, wherein the measurement instrument is established as a vector network analyzer.

6. The test system of claim 4, wherein the signal generator is configured to generate the source signal with the source frequency lying within a predetermined frequency spectrum.

7. The test system of claim 5, wherein the signal generator is configured to generate and forward a first source signal with a first source frequency to the first frequency divider and to generate and forward a second source signal with a second source frequency to the second frequency divider, wherein the frequencies of the first output signal and the second output signal are equal.

8. The test system of claim 4, wherein the measurement instrument is configured to compare the response of the device under test to the first output signal of the signal source with the response of the device under test to the second output signal of the signal source.

9. The test system of claim 8, wherein the measurement instrument is configured to determine a random phase offset of the second output signal based on the comparison of the two responses.

10. The test system of claim 9, wherein the measurement instrument is configured to determine the random phase offset by solving a coupled system of equations.

11. The test system of claim 9, wherein the measurement instrument is configured to correct the analysis of the response of the device under test to the second output signal based on the determined phase offset.

12. The test system of claim 4, wherein the second frequency divider is established as a fractional frequency divider.

13. The test system of claim 4, wherein a device under test is provided, the device under test being connected to the signal source and being connected to the measurement instrument.

14. A method for testing a device under test, comprising the following steps:
- providing a signal source comprising a signal generator, a first frequency divider and a second frequency divider;
- providing a measurement instrument and the device under test;
- generating a source signal via the signal generator and consecutively forwarding the source signal to the first frequency divider and the second frequency divider;
- generating a first output signal and a second output signal from the source signal via the first frequency divider and the second frequency divider, respectively, wherein a phase noise of the second output signal is considerably lower than a phase noise of the first output signal;
- consecutively forwarding the first output signal and the second output signal to the device under test; and
- analyzing a response of the device under test to the output signals of the signal source via the measurement instrument.

15. The method of claim 14, wherein a frequency of the first output signal and a frequency of the second output signal are equal.

16. The method of claim 14, wherein the response of the device under test to the first output signal is compared to the response of the device under test to the second output signal.

17. The method of claim 16, wherein a random phase offset of the second output signal is determined based on the comparison of the two responses.

18. The method of claim 17, wherein the random phase offset is determined by solving a coupled system of equations.

19. The method of claim 17, wherein the analysis of the response of the device under test to the second output signal is corrected based on the determined phase offset.

* * * * *